US012088110B2

United States Patent
Park et al.

(10) Patent No.: US 12,088,110 B2
(45) Date of Patent: Sep. 10, 2024

(54) VARIABLE WIRELESS POWER TRANSMITTER INCLUDING PLURAL RESONATORS AND METHOD OF CONTROLLING THE WIRELESS POWER TRANSMITTER

(71) Applicant: SAMSUNG ELECTRONICS CO., LTD., Suwon-si (KR)

(72) Inventors: Jaehyun Park, Suwon-si (KR); Beomwoo Gu, Suwon-si (KR); Jaeseok Park, Suwon-si (KR); Kangho Byun, Suwon-si (KR); Jaesun Shin, Suwon-si (KR); Sungku Yeo, Suwon-si (KR); Youngho Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/987,590

(22) Filed: Nov. 15, 2022

(65) Prior Publication Data

US 2023/0155416 A1    May 18, 2023

Related U.S. Application Data

(63) Continuation of application No. PCT/KR2022/017975, filed on Nov. 15, 2022.

(30) Foreign Application Priority Data

Nov. 15, 2021 (KR) .......................... 10-2021-0156426
Nov. 23, 2021 (KR) .......................... 10-2021-0162290

(51) Int. Cl.
*H02J 50/00* (2016.01)
*H02J 50/12* (2016.01)
(Continued)

(52) U.S. Cl.
CPC ............ *H02J 50/005* (2020.01); *H02J 50/12* (2016.02); *H02J 50/402* (2020.01); *H03H 7/38* (2013.01)

(58) Field of Classification Search
None
See application file for complete search history.

(56) References Cited

U.S. PATENT DOCUMENTS 10,186,372 B2    1/2019  John et al.
10,770,922 B2 *  9/2020  Baarman ................. H02J 50/70
(Continued)

FOREIGN PATENT DOCUMENTS

CN    102239622    11/2011
CN    102683770     9/2012
(Continued)

OTHER PUBLICATIONS

International Search Report dated Mar. 2, 2023 issued in International Application No. PCT/KR2022/017975 with English translation (5 pages).
(Continued)

*Primary Examiner* — Jared Fureman
*Assistant Examiner* — Joel Barnett
(74) *Attorney, Agent, or Firm* — Nixon & Vanderhye P.C.

(57) ABSTRACT

The disclosure provides a variable wireless power transmitter including a plurality of resonators and a method of controlling the variable wireless power transmitter. A wireless power transmitter of the disclosure may include: a housing; a power amplifier disposed inside the housing; a first resonator including at least one coil and fixed to a first portion of the housing; a second resonator including at least one coil, rotatably disposed at a second portion of the housing, and configured to form a variable angle with the first resonator; a sensor configured to sense a shape change
(Continued)

based on rotation of the second resonator; a controller configured to: identify a shape change of the first resonator and the second resonator based on a signal sensed by the sensor, identify whether impedance is matched for the first resonator or the second resonator based on the identification of the shape change, and generate a control signal for impedance matching for the first resonator or the second resonator based on identifying that the impedance is not matched; and a matching circuit including at least one coil and at least one capacitor, electrically coupled between the power amplifier and the first resonator, and configured to perform impedance matching based on the control signal received from the controller.

20 Claims, 12 Drawing Sheets

(51) Int. Cl.
*H02J 50/40* (2016.01)
*H03H 7/38* (2006.01)

(56) References Cited

U.S. PATENT DOCUMENTS

| | | |
|---|---|---|
| 2011/0241440 A1 | 10/2011 | Sakoda et al. |
| 2012/0229231 A1 | 9/2012 | Mi et al. |
| 2012/0286582 A1 | 11/2012 | Kim et al. |
| 2013/0159956 A1 | 6/2013 | Verghese et al. |
| 2013/0169057 A1* | 7/2013 | Jung .................... H02J 50/12 307/104 |
| 2014/0049211 A1 | 2/2014 | Park et al. |
| 2015/0180442 A1 | 6/2015 | Ryu et al. |
| 2017/0095667 A1* | 4/2017 | Yakovlev ............. A61B 5/0022 |
| 2018/0278095 A1 | 9/2018 | Baarman |
| 2022/0029467 A1* | 1/2022 | Halyal .................. H02J 50/50 |

FOREIGN PATENT DOCUMENTS

| | | |
|---|---|---|
| KR | 10-2012-0019033 A | 3/2012 |
| KR | 10-2012-0126333 | 11/2012 |
| KR | 10-1332224 | 11/2013 |
| KR | 10-2015-0145959 | 12/2015 |
| KR | 10-2019-0015861 A | 2/2019 |
| KR | 10-1973148 B1 | 8/2019 |
| WO | 2020/185877 A1 | 9/2020 |

OTHER PUBLICATIONS

Written Opinion dated Mar. 2, 2023 issued in International Application No. PCT/KR2022/017975 (3 pages).

* cited by examiner

VARIABLE WIRELESS POWER TRANSMITTER INCLUDING PLURAL RESONATORS AND METHOD OF CONTROLLING THE WIRELESS POWER TRANSMITTER

CROSS-REFERENCE TO RELATED APPLICATIONS

This application is a continuation of International Application No. PCT/KR2022/017975 designating the United States, filed on Nov. 15, 2022, in the Korean Intellectual Property Receiving Office and claiming priority to Korean Patent Application No. 10-2021-0156426, filed on Nov. 15, 2021, in the Korean Intellectual Property Office, and to Korean Patent Application No. 10-2021-0162290, filed on Nov. 23, 2021, in the Korean Intellectual Property Office, the disclosures of all of which are incorporated by reference herein in their entireties.

BACKGROUND

Field

The disclosure relates to a variable wireless power transmitter including a plurality of resonators and changeable in shape, and a method of controlling the wireless power transmitter.

Description of Related Art

Wireless charging technology relies on wireless power transmission and reception. For example, the battery of a mobile phone may be automatically charged by simply placing the mobile phone on a wireless power transmitter (e.g., a charging pad) without connecting a separate charging connector. Because the wireless charging technology does not require a connector to supply power to an electronic product, it offers the benefits of an improved waterproof function and enhanced portability due to no need for a wired charger.

Along with the development of the wireless charging technology, a technique of charging various electronic devices (e.g., wireless power receivers) by supplying power to them from a single electronic device (e.g., a wireless power transmitter) is being studied. The wireless charging technology includes an electromagnetic induction scheme using a coil, a resonance scheme using resonance, and a radio frequency (RF)/microwave radiation scheme in which electrical energy is converted into microwaves and transmitted.

For example, electromagnetic induction-based or resonance-based wireless charging techniques have been popular mainly in electronic devices such as smartphones. When a power transmitting unit (PTU) (e.g., a wireless power transmitter) and a power receiving unit (PRU) (e.g., a smartphone or a wearable electronic device) come into contact or approach within a certain distance, the battery of the PTU may be charged by electromagnetic induction or electromagnetic resonance between a transmission coil (or resonator) of the PTU and a reception coil (or resonator) of the PRU.

A PTU or a wireless power transmitter may include a resonator or coil capable of generating an induced magnetic field when current flows, according to the resonance scheme or the induction scheme. The resonator or the wireless power transmitter including the resonator may be configured in various shapes, and characteristics related to wireless power transmission may vary depending on the shape of the resonator or the shape of the wireless power transmitter.

For example, when current flows through the resonator, an electric field (E-field) may be generated simultaneously with an induced magnetic field in the vicinity of the resonator. Power may be transmitted to a PRU or a wireless power receiver by the induced magnetic field generated near the resonator, and the direction or characteristics of the magnetic field or the electric field may vary depending on the position or direction of at least one resonator included in the wireless power transmitter.

SUMMARY

Embodiments of the disclosure provide a wireless power transmitter that may include a plurality of resonators, and at least one of the plurality of resonators may be disposed to be rotatable. As the at least one resonator rotates, characteristics (e.g., impedance matching) of the wireless power transmitter may be changed, thereby decreasing wireless charging efficiency.

Embodiments of the disclosure may provide a variable wireless power transmitter including a plurality of resonators and changeable in shape, which may adjust impedance in correspondence with rotation of at least one resonator, and a method of controlling the wireless power transmitter.

According to various example embodiments, a wireless power transmitter may include: a housing; a power amplifier disposed inside the housing; a first resonator including at least one coil and fixed to a first portion of the housing; a second resonator including at least one coil, rotatably disposed in a second portion of the housing, and configured to form a variable angle with the first resonator; a sensor configured to sense a shape change based on rotation of the second resonator; a controller configured to: identify a shape change of the first resonator and the second resonator based on a signal sensed by the sensor, identify whether impedance is matched for the first resonator or the second resonator based on the identification of the shape change, and generate a control signal for impedance matching for the first resonator or the second resonator based on identifying that the impedance is not matched; and a matching circuit including at least one coil and at least one capacitor, electrically coupled between the power amplifier and the first resonator, and configured to perform impedance matching based on the control signal received from the controller.

According to various example embodiments, a method of controlling a variable wireless power transmitter including a housing, a power amplifier disposed inside the housing, a first resonator including at least one coil and fixed to a first portion of the housing, and a second resonator including at least one coil, rotatably disposed in a second portion of the housing, and configured to form a variable angle with the first resonator may include: sensing a shape change based on rotation of the second resonator through a sensor; identifying a shape change of the first resonator and the second resonator based on a signal sensed by the sensor; identifying whether impedance is matched for the first resonator or the second resonator, based on the identification of the shape change; generating a control signal for impedance matching for the first resonator or the second resonator, based on identifying that the impedance is not matched; and adjusting impedance of a matching circuit including at least one coil and at least one capacitor, based on the generated control signal.

According to various example embodiments, a wireless power transmitter may include: a housing; a power amplifier disposed inside the housing; a first resonator including at least one coil and fixed to a first portion of the housing; a second resonator including at least one coil, rotatably disposed in a second portion of the housing, and configured to form a variable angle with the first resonator; a sensor configured to sense a shape change based on rotation of the second resonator; a controller configured to: identify a shape change of the first resonator and the second resonator based on a signal sensed by the sensor, select at least one resonator by sequentially controlling turning on and off the first resonator or the second resonator, based on the identification of the shape change, identify whether impedance is matched for the selected at least one resonator, and generate a control signal for impedance matching for the selected at least one resonator, based on identifying that the impedance is not matched; and a matching circuit including at least one coil and at least one capacitor, electrically coupled between the power amplifier and the first resonator, and configured to perform impedance matching based on the control signal received from the controller.

A variable wireless power transmitter including a plurality of resonators and a method of controlling the variable wireless power transmitter according to various example embodiments may increase wireless charging efficiency by adjusting a setting of a matching circuit, even though characteristics (e.g., impedance matching) of the wireless power transmitter are changed due to rotation of at least one resonator.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
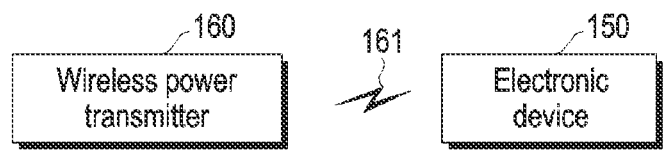
FIG. 1A is a block diagram illustrating an example wireless power transmitter and a wireless power receiver according to various embodiments.

Various example embodiments of the disclosure will be described in greater detail with reference to the accompanying drawings. It should be noted that like reference numerals denote the same components the same components in the drawings, wherever possible. In the following description and accompanying drawings, lest it should obscure the subject matter of the disclosure, a detailed description of a known function and construction may be avoided.

Referring to FIG. 1A, a wireless power transmitter 160 (e.g., an electronic device) according to various embodiments may wirelessly transmit power 161 to a wireless power receiver 150 (hereinafter, referred to as an "electronic device 150" or an "external electronic device"). The wireless power transmitter 160 may transmit the power 161 to the electronic device 150 according to various charging schemes. For example, the wireless power transmitter 160 may transmit the power 161 according to an induction scheme. When the wireless power transmitter 160 operates based on the induction scheme, the wireless power transmitter 160 may include, for example, a power source, a direct current (DC) to alternating current (AC) conversion circuit, an amplification circuit, an impedance matching circuit, at least one capacitor, at least one coil, a communication modulation/demodulation circuit, and so on. The at least one capacitor together with the at least one coil may form a resonant circuit. The wireless power transmitter 160 may operate in a manner defined by the wireless power consortium (WPC) standard (or Qi standard).

For example, the wireless transmitter 160 may transmit the power 161 according to a resonance scheme. In the case of the resonance scheme, the wireless power transmitter 160 may include, for example, a power source, a DC to AC conversion circuit, an amplification circuit, an impedance matching circuit, at least one capacitor, at least one resonator or coil, an out-band communication circuit (e.g., a Bluetooth low energy (BLE) communication circuit), and so on. The at least one capacitor and the at least one resonator or coil may form a resonant circuit. The wireless power transmitter 160 may operate in a manner defined by the alliance for wireless power (A4WP) standard (or the air fuel alliance (AFA) standard). The wireless power transmitter 160 may include a resonator or coil which when current flows, may generate an induced magnetic field according to the resonance scheme or the induction scheme. A process of generating an induced magnetic field by the wireless power transmitter 160 may be expressed as wireless transmission of the power 161 from the wireless power transmitter 160. In addition, the electronic device 150 may include a coil in which an induced electromotive force is generated by a magnetic field with a magnitude changing over time, formed around the coil. A process of generating an induced electromotive force through a resonator or a coil by the electronic device 150 may be expressed as wireless reception of the power 161 at the electronic device 150.

The wireless power transmitter 160 according to various embodiments of the disclosure may communicate with the electronic device 150. For example, the wireless power transmitter 160 may communicate with the electronic device 150 in an in-band manner. The wireless power transmitter 160 or the electronic device 150 may change a load (or impedance) in correspondence with data to be transmitted, for example, according to an on/off keying modulation scheme. The wireless power transmitter 160 or the electronic device 150 may identify the data to be transmitted to the other device by measuring a load change (or impedance change) based on a change in the magnitude of the current, voltage, or power of the resonator or the coil.

For example, the wireless power transmitter 160 may communicate with the electronic device 150 in an out-band (or out-of-band) manner. The wireless power transmitter 160 or the electronic device 150 may transmit/receive data using a short-range communication module (e.g., a BLE communication module) provided separately from the resonator, the coil, or a patch antenna.

Figure 1B:
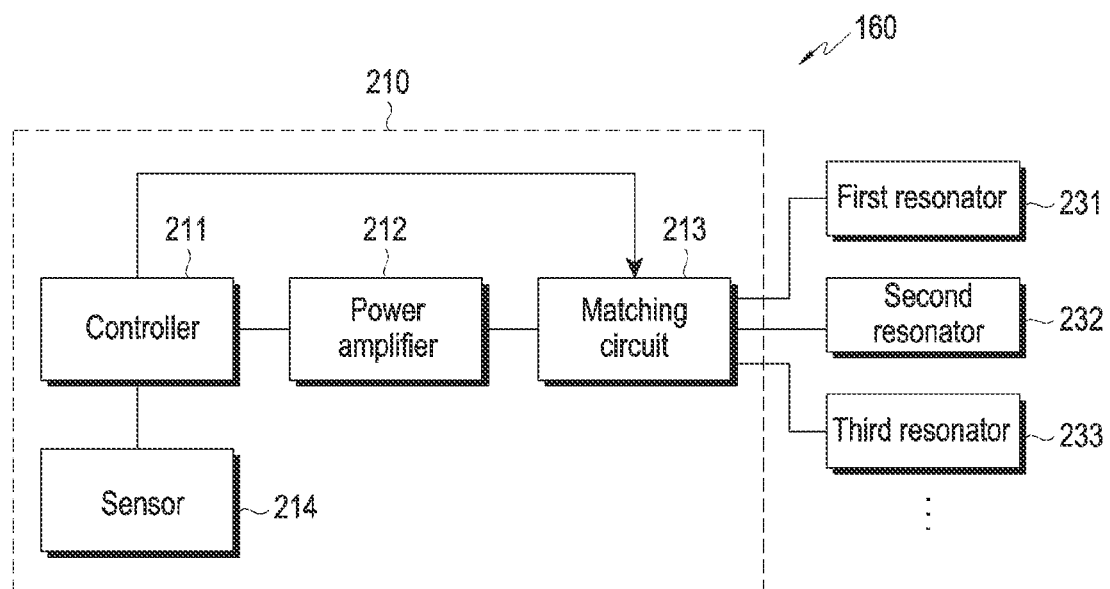
FIG. 1B is a block diagram illustrating an example configuration of a wireless power transmitter according to various embodiments.

FIG. 1B is a block diagram illustrating an example configuration of a wireless power transmitter according to various embodiments. Referring to FIG. 1B, the wireless power transmitter 160 may include a controller (e.g., including processing circuitry) 211, a power amplifier 212, a matching circuit 213, a sensor 214, and at least one resonator (e.g., at least one of a first resonator 231, a second resonator 232, or a third resonator 233). For example, the controller 211, the power amplifier 212, the matching circuit 213, and the sensor 214 may be included inside a housing 210 or disposed outside the housing 210.

According to various embodiments, each resonator (e.g., the first resonator 231, the second resonator 232, or the third resonator 233) may include at least one coil, and may further include at least one capacitor. Each resonator (e.g., the first resonator 231, the second resonator 232, or the third resonator 233) may include an N-turn coil forming a loop, and contain a ferrite in at least part thereof. According to various embodiments, the at least one resonator may be included in the housing 210 or disposed outside the housing 210. For example, the first resonator 231 may be fixed to a first portion of the housing 210, and the second resonator 232 may be rotatably disposed in a second portion of the housing 210 to form a variable angle with the first resonator 231. The third resonator 233 may be fixed to a third portion of the housing 210. Examples of the arrangement of the at least one resonator will be described in greater detail below with reference to FIGS. 2A, 2B, 3A, 3B, and 3C.

According to various embodiments, the sensor 214 may sense that the second resonator 232 has rotated in the second portion of the housing 210. The sensor 214 may sense a change in the shape of the wireless power transmitter 160 caused by the rotation of the second resonator 232 in the second portion of the housing 210. A signal sensed by the sensor 214 may be transmitted to the controller 211. For example, the sensor 214 may include a switch which is controlled to be on/off in correspondence with the rotation of the second resonator 232, and identify the shape of the wireless power transmitter 160 based on whether the switch is in an on state or an off state. According to an embodiment, the sensor 214 may include a variable resistor with a resistance value changing in correspondence with the rotation of the second resonator 232, and identify the shape of the wireless power transmitter 160 based on the resistance value of the variable resistor. The sensor 214 may include any type of structure or device capable of sensing the rotation of the second resonator 232.

According to various embodiments, the controller 211 may include various processing circuitry and identify whether the second resonator 232 has rotated or the shape of the wireless power transmitter 160 has been changed based on the signal received from the sensor 214. According to various embodiments, the controller 211 may identify whether the wireless power transmitter 160 is in a first shape (e.g., a stand shape or a stand mode shape) or a second shape (e.g., a pad shape or a pad mode shape) based on the signal received from the sensor 214.

According to various embodiments, the controller 211 may generate a control signal based on whether the second resonator 232 has rotated or whether the shape of the wireless power transmitter 160 has been changed. The control signal generated by the controller 211 may include a signal for adjusting impedance by adjusting a setting of the matching circuit 213. The controller 211 may transmit the generated control signal to the matching circuit 213, and the matching circuit 213 may change the setting based on the control signal received from the controller 211.

According to various embodiments, the power amplifier 212 may include an inverter. The power amplifier 212 may output a signal corresponding to a configured frequency from input power. For example, when the wireless power transmitter 160 transmits wireless power according to the standard of the resonance scheme, the configured frequency may be, but not limited to, 6.78 MHz. A signal output from the power amplifier 212 may be input to the matching circuit 213.

According to various embodiments, the matching circuit 213 may receive the signal from the power amplifier 213 and perform impedance matching. For example, the matching circuit 213 may provide impedance matching such that output impedance matches the impedance of a load. The matching circuit 213 may include, for example, at least one low-pass filter and/or a band stop filter, and the low-pass filter may include at least one capacitor.

According to various embodiments, the impedance-matched signal from the matching circuit 213 may be transmitted to the at least one resonator (e.g., the first resonator 231, the second resonator 232, or the third resonator 233). As current flows, the at least one resonator (e.g., the first resonator 231, the second resonator 232, or the third resonator 233) may generate an induced magnetic field based on the resonance scheme or the induction scheme. A process of generating an induced magnetic field by the at least one resonator (e.g., the first resonator 231, the second resonator 232, or the third resonator 233) may be expressed as wireless transmission of the power 161 from the wireless power transmitter 160.

According to various embodiments, the matching circuit 213 may change a setting based on the control signal received from the controller 211 as described above. For example, the matching circuit 213 may adjust impedance by changing a setting of a capacitor or a coil included in the matching circuit 213 based on the control signal received from the controller 211.

According to various embodiments, the wireless power transmitter 160 may include a plurality of resonators as illustrated in FIGS. 2A, 2B, 3A, 3B, and 3C to be described in greater detail below, and as at least one resonator rotates, the shape of the wireless power transmitter 160 may be changed.

Figure 2A:
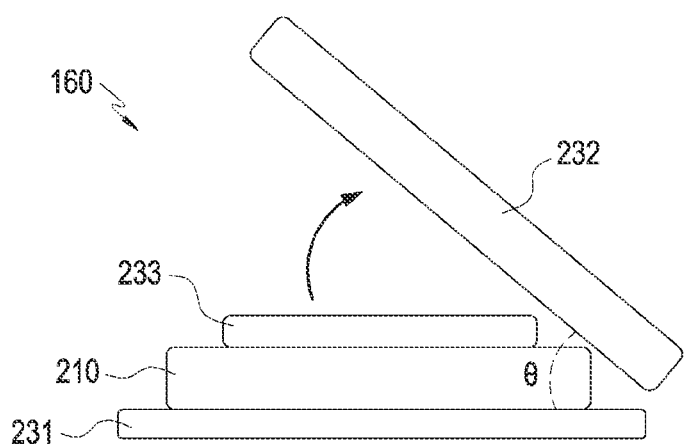
FIG. 2A is a diagram illustrating a side view of a variable wireless power transmitter including a plurality of resonators according to various embodiments.
Figure 2B:
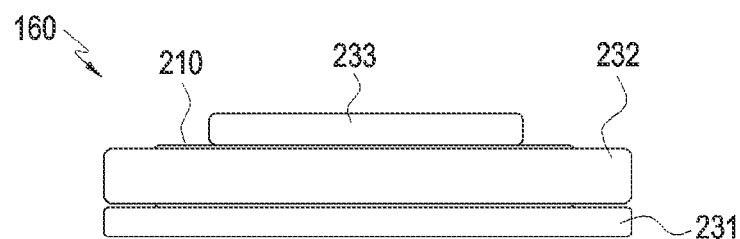
FIG. 2B is a diagram illustrating a side view of a variable wireless power transmitter including a plurality of resonators according to various embodiments.

FIGS. 2A and 2B are diagrams illustrating side views of a variable wireless power transmitter including a plurality of resonators according to various embodiments. Referring to FIGS. 2A and 2B, the wireless power transmitter 160 may include at least one resonator (e.g., the first resonator 231, the second resonator 232, or the third resonator 233). For example, the first resonator 231 may include at least one coil and be fixed to the first portion of the housing 210 (e.g., under the housing 210). The second resonator 232 may include at least one coil and be rotatably disposed in the second portion of the housing 210 (e.g., a side surface of the housing 210) to form a variable angle (e.g., θ) with the first resonator 231. For example, as the second resonator 232 rotates, the wireless power transmitter 160 may be in the first shape (e.g., the stand shape or the stand mode shape) illustrated in FIG. 2A or in the second shape (e.g., the pad shape or the pad mode shape) illustrated in FIG. 2B. According to various embodiments, as described above, the wireless power transmitter 160 may sense whether the second resonator 232 has rotated or a change in the shape of the wireless power transmitter 160 caused by the rotation of the second resonator 232, by means of the sensor 214.

According to various embodiments, the second resonator 232 may be coupled to the first resonator 231 by an electromagnetic field. According to another embodiment, the second resonator 232 may be electrically coupled to the first resonator 231.

According to various embodiments, the wireless power transmitter 160 may include at least one coil, and may further include the third resonator 233 disposed in the third portion of the housing 210 (e.g., on the housing 210). The third resonator 233 may be coupled to the first resonator 231 by an electromagnetic field. According to another embodiment, the third resonator 233 may be electrically coupled to the first resonator 231.

According to various embodiments, when the shape of the wireless power transmitter 160 is changed as the second resonator 232 rotates, characteristics (e.g., impedance matching) of the wireless power transmitter 160 may be changed. In addition, as the characteristics of the wireless power transmitter 160 are changed, wireless charging efficiency may decrease.

In various embodiments to be described in greater detail below, impedance may be adjusted by adjusting a setting of the matching circuit 213 in correspondence with rotation of at least one resonator (e.g., the second resonator 232) in the wireless power transmitter 160.

Figure 3A:
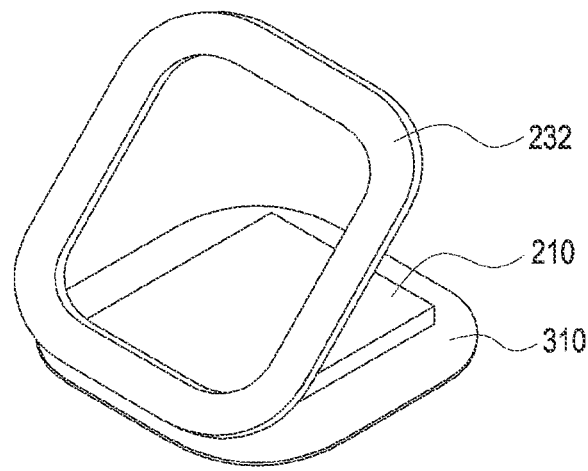
FIG. 3A is a perspective view illustrating a variable wireless power transmitter including a plurality of resonators according to various embodiments.
Figure 3B:
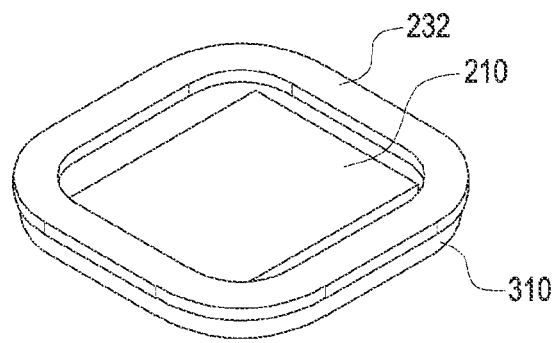
FIG. 3B is a perspective view illustrating a variable wireless power transmitter including a plurality of resonators according to various embodiments.
Figure 3C:
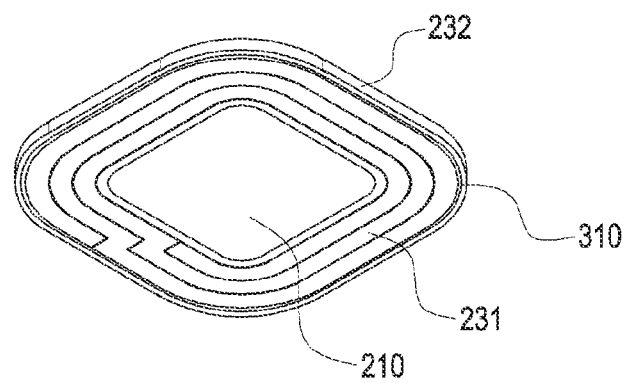
FIG. 3C is a perspective view illustrating a variable wireless power transmitter including a plurality of resonators according to various embodiments.

FIGS. 3A, 3B, and 3C are perspective views illustrating a variable wireless power transmitter including a plurality of resonators according to various embodiments. Referring to FIGS. 3A, 3B, and 3C, the wireless power transmitter 160 may include at least one resonator (e.g., the first resonator 231, the second resonator 232, or the third resonator 233).

According to various embodiments, the second resonator 232 may include at least one coil, be rotatably disposed in the second portion of the housing 210 (e.g., the side surface of the housing 210), and form a variable angle (e.g., θ) with the first resonator 231. For example, as the second resonator 232 rotates, the wireless power transmitter 160 may be in the first shape (e.g., the stand shape or the stand mode shape) illustrated in FIG. 3A or in the second shape (e.g., in the pad shape or the pad mode shape) illustrated in FIG. 3B.

According to various embodiments, the first shape (e.g., the stand shape or the stand mode shape) illustrated in FIG. 3A may provide relatively high efficiency, when a user places the wireless power receiver (e.g., the electronic device 150) against the second resonator 232 or disposes the wireless power receiver (e.g., the electronic device 150) to be spaced apart from the second resonator 232 by a certain distance or larger. The second shape (e.g., the pad shape or the pad mode shape) illustrated in FIG. 3B may provide relatively high efficiency, when the user places the wireless power receiver (e.g., the electronic device 150) on top of the housing 210 or in the vicinity of the wireless power transmitter 160. The efficiency based on the shape of the wireless power transmitter 160 is merely an example, and is not limited to the above example.

According to various embodiments, a shielding structure 310 (e.g., ferrite) may be disposed under the housing 210. Referring to FIG. 3C, the first resonator 231 may be disposed on the opposite side of the housing 210 with respect to the shielding structure 310. The shielding structure 310 may serve to shield a magnetic field or an electric field generated by the first resonator 231 from affecting the components in the housing 210.

According to various embodiments, while not illustrated in FIGS. 3A, 3B, and 3C, the third resonator 233 may be further disposed on the housing 210 as described above with reference to FIGS. 2A and 2B.

Figure 4:
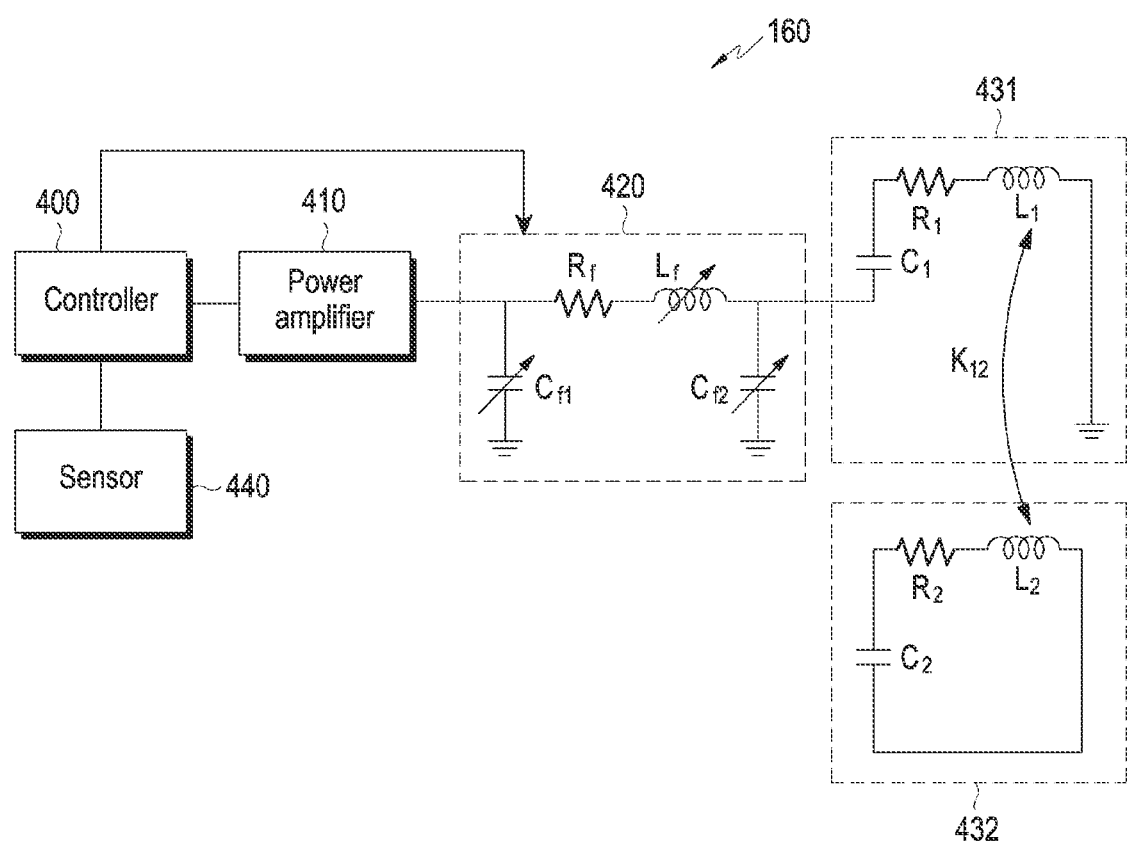
FIG. 4 is a circuit diagram illustrating an example wireless power transmitter according to various embodiments.

FIG. 4 is a circuit diagram illustrating an example wireless power transmitter according to various embodiments. Referring to FIG. 4, the wireless power transmitter 160 according to various embodiments may include a controller (e.g., including processing circuitry) 400, a power amplifier 410, a matching circuit 420, a first resonator 431, a second resonator 432, and/or a sensor 440. The controller 400, the power amplifier 410, and the sensor 440 illustrated in FIG. 4 may correspond to the controller 211, the power amplifier 212, and the sensor 214 described before with reference to FIG. 1B, respectively.

According to various embodiments, the matching circuit 420 may include at least one coil and at least one capacitor. For example, the matching circuit 420 may be electrically coupled between the first resonator 431 or the second resonator 432 and the power amplifier 410, and match impedance based on a control signal received from the controller 400.

According to various embodiments, the matching circuit 420 may include a resistor $R_f$, a variable coil $L_f$, a first variable capacitor $C_{f1}$, and a second variable capacitor $C_{f2}$. As described above, when the sensor 440 senses rotation of the second resonator 432, the controller 400 may identify whether the second resonator 432 has rotated based on a signal received from the sensor 440 or a change in the shape of the wireless power transmitter 160. The controller 400 may transmit a control signal to the matching circuit 420 based on whether the second resonator 432 has rotated or the change in the shape of the wireless power transmitter 160. The matching circuit 420 may change a setting of at least one of the variable coil $L_f$, the first variable capacitor $C_{f1}$, or the second variable capacitor $C_{f2}$ included in the matching circuit 420 based on the control signal. For example, the matching circuit 420 may adjust the inductance of the variable coil $L_f$ included in the matching circuit 420 based on the control signal. In another example, the matching circuit 420 may change the capacitance of at least one of the first variable capacitor $C_{f1}$ or the second variable capacitor $C_{f2}$ included in the matching circuit 420 based on the control signal.

According to various embodiments, the first resonator 431 may be electrically coupled to the matching circuit 420. For example, the first resonator 431 may include a first resistor $R_1$, a first coil $L_1$, and a first capacitor $C_1$. The first resistor $R_1$ may include a resistor disposed on the circuit of the first resonator 431. In another embodiment, the first resistor $R_1$ may include a resistance value corresponding to a coil (e.g., the first coil $L_1$) included in the first resonator 431.

According to various embodiments, the second resonator 432 may be coupled to the first resonator 431 by an electromagnetic field through inductive coupling. A coupling coefficient between the first resonator 431 and the second resonator 432 may be expressed as $K_{12}$. For example, the first resonator 431 and the second resonator 432 may be electromagnetically coupled to each other, for magnetic induction. For example, the second resonator 432 may transmit power to the wireless power receiver (e.g., the electronic device 150) by forming a magnetic field by power induced through coupling with the first resonator 431. According to various embodiments, the second resonator 432 may include a second resistor $R_2$, a second coil $L_2$, and a second capacitor $C_2$. The second resistor $R_2$ may include a resistor disposed on the circuit of the second resonator 432, and in another embodiment, may include a resistance value corresponding to a coil (e.g., the second coil $L_2$) included in the second resonator 432.

Figure 5A:
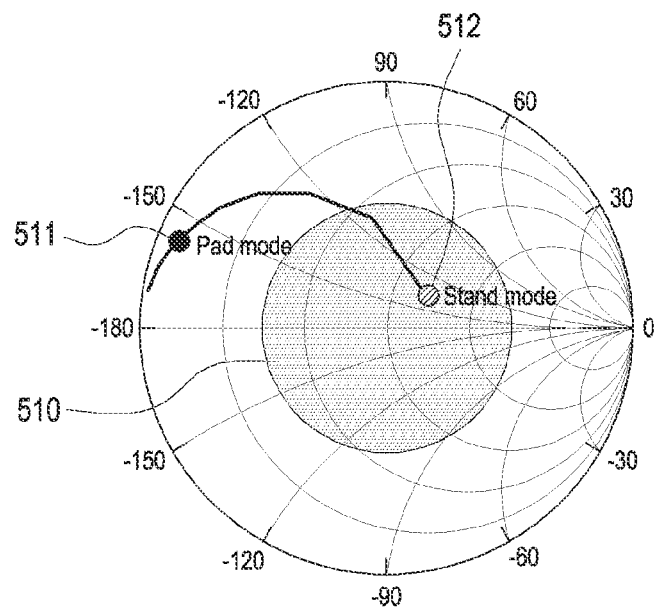
FIG. 5A is a diagram illustrating impedance according to a change in the shape of a variable wireless power transmitter including a plurality of resonators according to various embodiments.
Figure 5B:
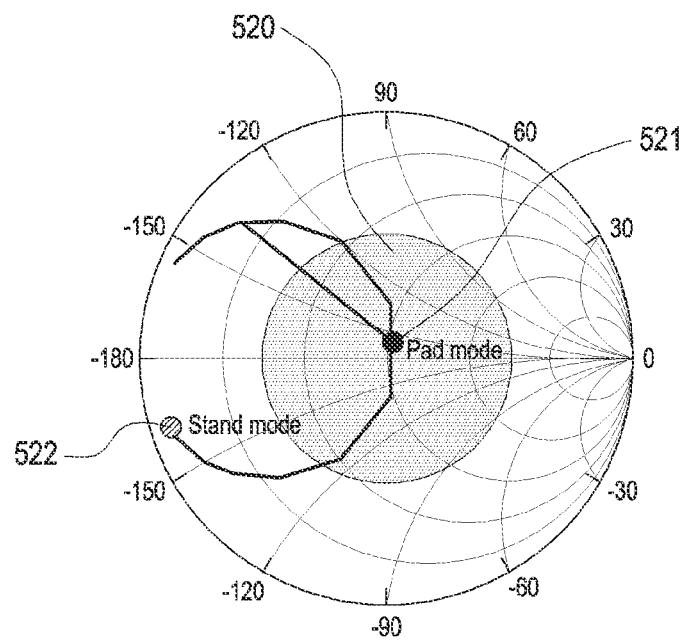
FIG. 5B is a diagram illustrating impedance according to a change in the shape of a variable wireless power transmitter including a plurality of resonators according to various embodiments.

FIGS. 5A and 5B are diagrams illustrating impedance according to a change in the shape of a variable wireless power transmitter including a plurality of resonators according to various embodiments. Referring to FIGS. 5A and 5B, it may be assumed for purposes of non-limiting example that the first coil $L_1$ included in the first resonator 431 has an inductance of 2 μH and a Q-factor of 200 in the circuit of FIG. 4. In addition, it may be assumed that the second coil $L_2$ included in the second resonator 432 has an inductance of 2 μH, and a Q-factor of 400 in the circuit of FIG. 4.

According to various embodiments, the shape of the wireless power transmitter 160 is changed from the first shape of FIG. 2A to the second shape of FIG. 2B or from the second shape of FIG. 2B to the first shape of FIG. 2A, the physical inductance of the first resonator 431 or the second resonator 432 (e.g., the inductance of the first coil $L_1$ or the inductance of the second coil $L_2$) may be changed. In addition, when the shape of the wireless power transmitter 160 is changed from the first shape of FIG. 2A to the second shape of FIG. 2B or from the second shape of FIG. 2B to the first shape of FIG. 2A, coupling (e.g., $K_{12}$) between the first resonator 431 and the second resonator 432 may be changed.

According to various embodiments, FIG. 5A illustrates an impedance change according to a change in the angle between the first resonator 231 and the second resonator 232, when the capacitance of a variable capacitor (e.g., at least one of the first variable capacitor $C_{f1}$ or the second variable capacitor $C_{f2}$) included in the matching circuit 420 is set to a first setting value (e.g., 1.9 nF). FIG. 5B illustrates an impedance change according to a change in the angle between the first resonator 231 and the second resonator 232, when the capacitance of a variable capacitor (e.g., at least one of the first variable capacitor $C_{f1}$ or the second variable capacitor $C_{f2}$) included in the matching circuit 420 is set to a second setting value (e.g., 4 nF).

Referring to FIG. 5A, in the case where the capacitance of a variable capacitor (e.g., at least one of the first variable capacitor $C_{f1}$ or the second variable capacitor $C_{f2}$) included in the matching circuit 420 is set to the first setting value (e.g., 1.9 nF), as the second resonator 232 rotates, the impedance of a second point 512 may be measured in the first shape (e.g., the stand shape or the stand mode shape) of the wireless power transmitter 160 illustrated in FIG. 2A, and the impedance of a first point 511 may be measured in the second shape (e.g., the pad shape or the pad mode shape) of the wireless power transmitter 160 illustrated in FIG. 2B. For example, as illustrated in FIG. 5A, when the capacitance of a variable capacitor included in the matching circuit 420 is set to the first setting value, it may be noted that the impedance is included in an impedance matching area 510 in the first shape (e.g., the stand shape or the stand mode shape) illustrated in FIG. 2A.

Referring to FIG. 5B, in the case where the capacitance of a variable capacitor (e.g., at least one of the first variable capacitor $C_{f1}$ or the second variable capacitor $C_{f2}$) included in the matching circuit 420 is set to the second setting value (e.g., 4 nF), as the second resonator 232 rotates, the impedance of a fourth point 522 may be measured in the first shape (e.g., the stand shape or the stand mode shape) of the wireless power transmitter 160 illustrated in FIG. 2A, and the impedance of a third point 521 may be measured in the second shape (e.g., the pad shape or the pad mode shape) of the wireless power transmitter 160 illustrated in FIG. 2B. For example, as illustrated in FIG. 5B, when the capacitance of a variable capacitor included in the matching circuit 420 is set to the second setting value, it may be noted that the impedance is included in an impedance matching area 520 in the second shape (e.g., the pad shape or the pad mode shape) illustrated in FIG. 2B.

According to various embodiments, referring to FIGS. 5A and 5B, when the capacitance of a variable capacitor included in the matching circuit 420 is set to the first setting value in the first shape (e.g., the stand shape or the stand mode shape) of the wireless power transmitter 160 illustrated in FIG. 2A, the impedance may be included in the matching area as illustrated in FIG. 5A, whereas when the capacitance of the variable capacitor included in the matching circuit 420 is set to the second setting value in the second shape (e.g., the pad shape or the pad mode shape) of the wireless power transmitter 160 illustrated in FIG. 2B, the impedance may be included in the matching area as illustrated in FIG. 5B.

According to various embodiments, when identifying the shape of the wireless power transmitter 460 as the first shape (e.g., the stand shape or the stand mode shape) illustrated in FIG. 2A based on a signal sensed from the sensor 440, the controller 400 may generate a control signal to set the capacitance of the variable capacitor included in the matching circuit 420 to the first setting value, and transmit the generated control signal to the matching circuit 420. When identifying the shape of the wireless power transmitter 460 as the second shape (e.g., the pad shape or the pad mode shape) illustrated in FIG. 2B based on the signal sensed from the sensor 440, the controller 400 may generate a control signal to set the capacitance of the variable capacitor included in the matching circuit 420 to the second setting value, and transmit the generated control signal to the matching circuit 420.

Figure 6:
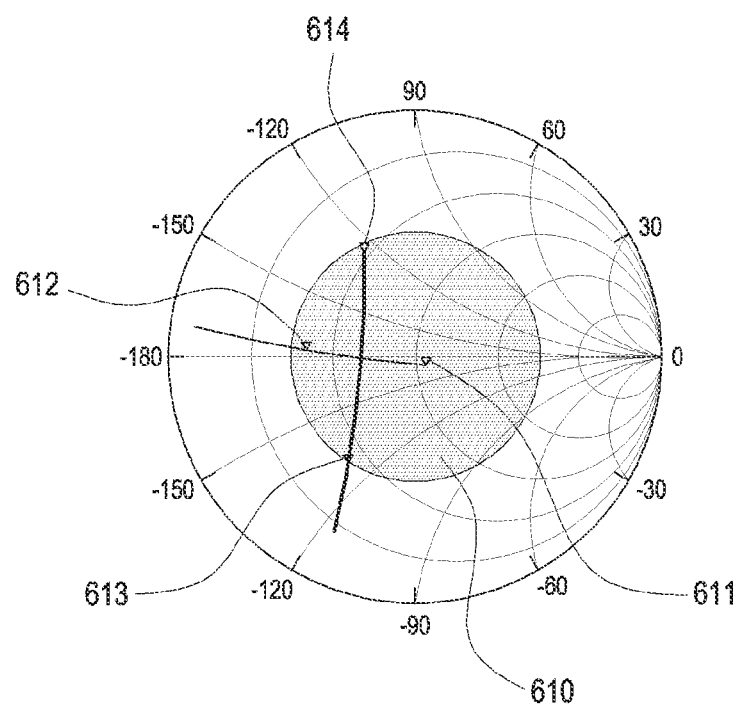
FIG. 6 is a diagram illustrating impedance according to a change in the distance of a variable wireless power transmitter including a plurality of resonators according to various embodiments.

FIG. 6 is a diagram illustrating impedance according to a change in the distance of a variable wireless power transmitter including a plurality of resonators according to various embodiments. Referring to FIG. 6, impedance may be changed according to a change in the distance between the wireless power transmitter 160 and the wireless power receiver (e.g., the electronic device 150).

For example, in the case where the inductance of the variable coil $L_f$ included in the matching circuit 420 is set to a first setting value (e.g., 0.15 µH), when the value of $K_{12}$ is changed from 0.0100 to 0.0300 according to a change in the distance between the wireless power transmitter 160 and the wireless power receiver (e.g., the electronic device 150), it may be noted that the impedance is changed from a first point 611 to a second point 612. In a comparative example, in the case where the inductance of the variable coil $L_f$ included in the matching circuit 420 is set to a second setting value (e.g., 0.3 µH), when the value of $K_{12}$ is changed from 0.0300 to 0.0100 according to a change in the distance between the wireless power transmitter 160 and the wireless power receiver (e.g., the electronic device 150), it may be noted that the impedance is changed from a third point 613 to a fourth point 614.

According to various embodiments, the controller 400 may control to include the impedance in the matching area 610 by adjusting the inductance of the variable coil $L_f$ included in the matching circuit 420 based on the value of $K_{12}$ changed according to a change in the distance between the wireless power transmitter 160 and the wireless power receiver (e.g., the electronic device 150).

Figure 7:
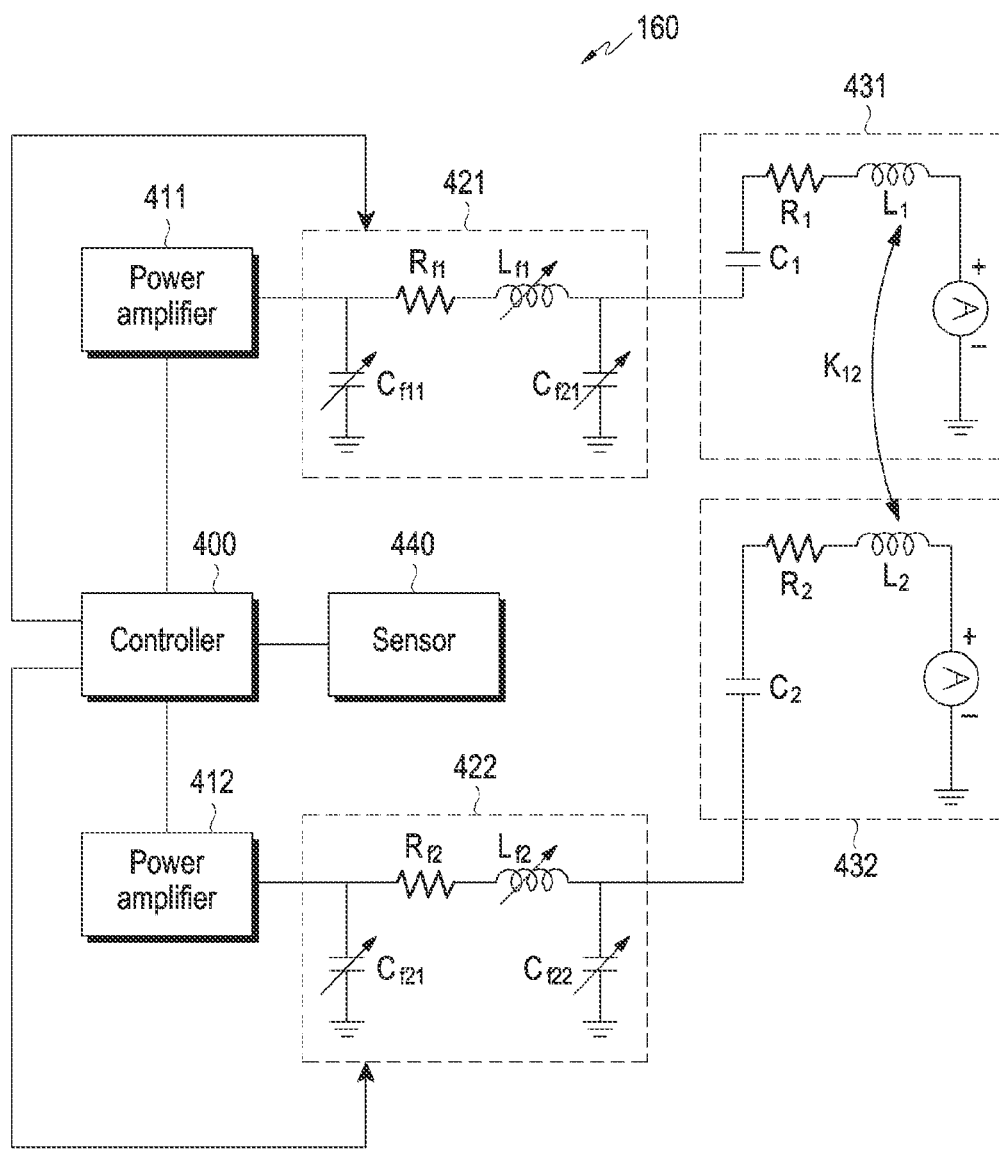
FIG. 7 is a circuit diagram illustrating an example wireless power transmitter according to various embodiments.

FIG. 7 is a circuit diagram illustrating an example wireless power transmitter according to various embodiments. Referring to FIG. 7, the wireless power transmitter 160 according to various embodiments may include the controller (e.g., including processing circuitry) 400, a first power amplifier 411, a second power amplifier 412, a first matching circuit 421, and a second matching circuit 422, the first resonator 431, the second resonator 432, and/or the sensor 440. The controller 400 illustrated in FIG. 7 may correspond to the controller 211 described before with reference to FIG. 1B. The first power amplifier 411 or the second power amplifier 412 illustrated in FIG. 7 may correspond to the power amplifier 212 described before with reference to FIG. 1B. The sensor 440 illustrated in FIG. 7 may correspond to the sensor 214 described before with reference to FIG. 1B.

According to various embodiments, the first matching circuit 421 or the second matching circuit 422 may include at least one coil and at least one capacitor. For example, the first matching circuit 421 may be electrically coupled between the first power amplifier 411 and the first resonator 431. The second matching circuit 422 may be electrically coupled between the second power amplifier 412 and the second resonator 432. The first matching circuit 421 or the second matching circuit 422 may match impedance based on a control signal received from the controller 400.

According to various embodiments, the first matching circuit 421 or the second matching circuit 422 may include a resistor $R_{f1}$ or $R_{f2}$, a variable coil $L_{f1}$ or $L_{f2}$, a first variable capacitor $C_{f11}$ or $C_{f21}$, and a second variable capacitor $C_{f21}$ or $C_{f22}$. As described above, when the sensor 440 senses rotation of the second resonator 432, the controller 400 may identify whether the second resonator 432 has rotated or identify a change in the shape of the wireless power transmitter 160 based on a signal received from the sensor 440. The controller 400 may transmit a control signal to the first matching circuit 421 and/or the second matching circuit 422 based on whether the second resonator 432 has rotated or based on the change in the shape of the wireless power transmitter 160. The first matching circuit 421 and/or the second matching circuit 422 may change a setting of at least one of the variable coil $L_f$, the first variable capacitor $C_{f1}$, or the second variable capacitor $C_{f2}$ included in the first matching circuit 421 and/or the second matching circuit 422 based on the control signal. For example, the first matching circuit 421 and/or the second matching circuit 422 may adjust the inductance of the variable coil $L_f$ included in the first matching circuit 421 and/or the second matching circuit 422 based on the control signal. For example, the first matching circuit 421 and/or the second matching circuit 422 may adjust the capacitance of at least one of the first variable capacitor $C_{f1}$ or the second variable capacitor $C_{f2}$ included in the first matching circuit 421 and/or the second matching circuit 422.

According to various embodiments, the first resonator 431 may be electrically coupled to the first matching circuit 421. For example, the first resonator 431 may include the first resistor $R_1$, the first coil $L_1$, and the first capacitor $C_1$. The first resistor $R_1$ may include a resistor disposed on the circuit of the first resonator 431, and in an embodiment, include a resistance value corresponding to the coil (e.g., the first coil $L_1$) included in the first resonator 431. According to various embodiments, the first resonator 431 may be electrically coupled to the first matching circuit 421.

According to various embodiments, the second resonator 432 may be electrically coupled to the second matching circuit 422. According to various embodiments, the second resonator 432 may include the second resistor $R_2$, the second coil $L_2$, and the second capacitor $C_2$. The second resistor $R_2$ may include a resistor disposed on the circuit of the second resonator 432, and in an embodiment, may include a resistance value corresponding to the coil (e.g., the second coil $L_2$) included in the second resonator 432. According to various embodiments, the first resonator 431 and the second resonator 432 may be electromagnetically coupled to each other, for magnetic induction.

Figure 8:
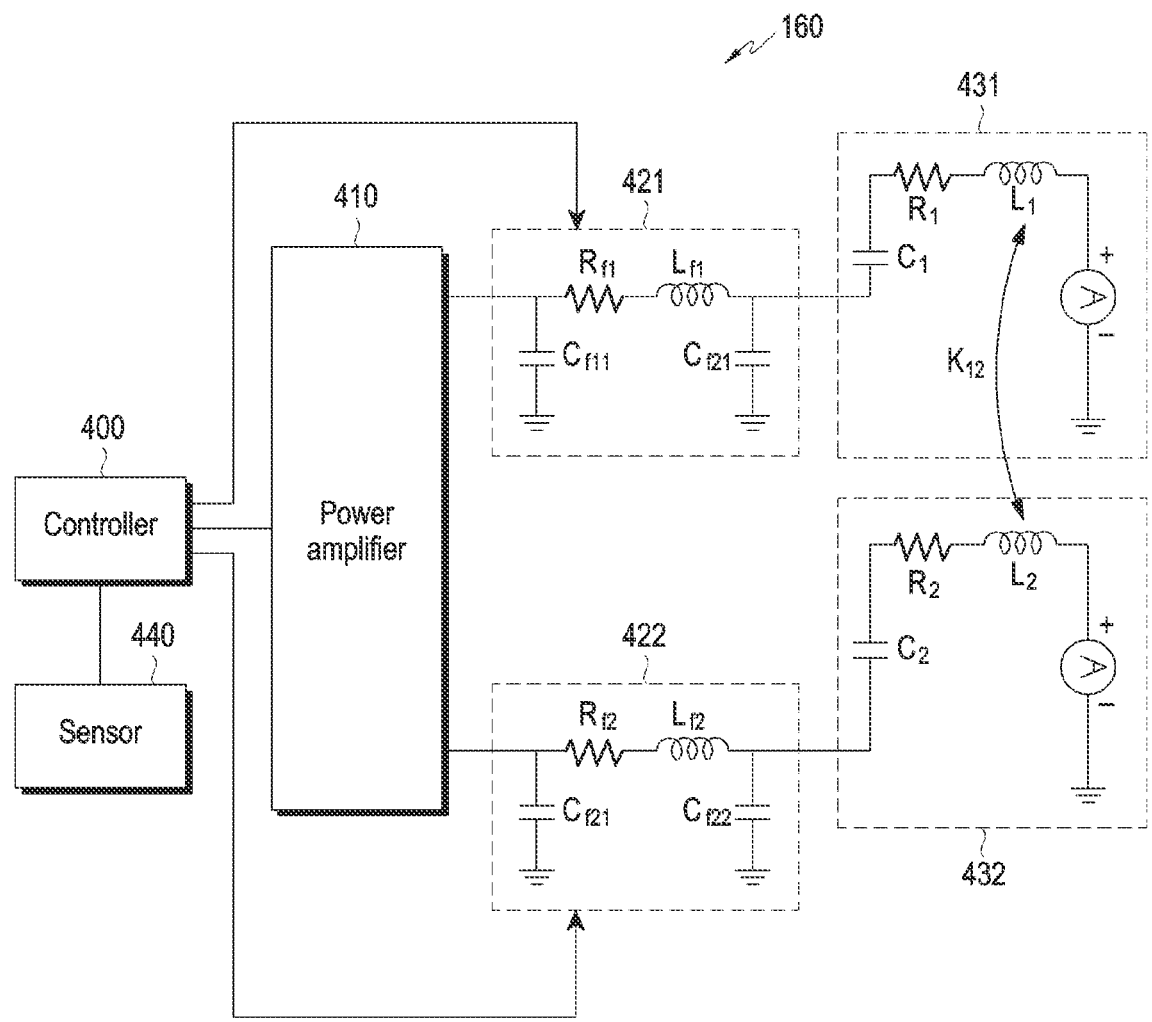
FIG. 8 is a circuit diagram illustrating an example wireless power transmitter according to various embodiments.

FIG. 8 is a circuit diagram illustrating an example wireless power transmitter according to various embodiments. Referring to FIG. 8, compared to FIG. 7, the single power amplifier 410 may be coupled to the first matching circuit 421 and the second matching circuit 422. The power amplifier 410 may transmit power to each of the first matching circuit 421 and the second matching circuit 422.

Figure 9:
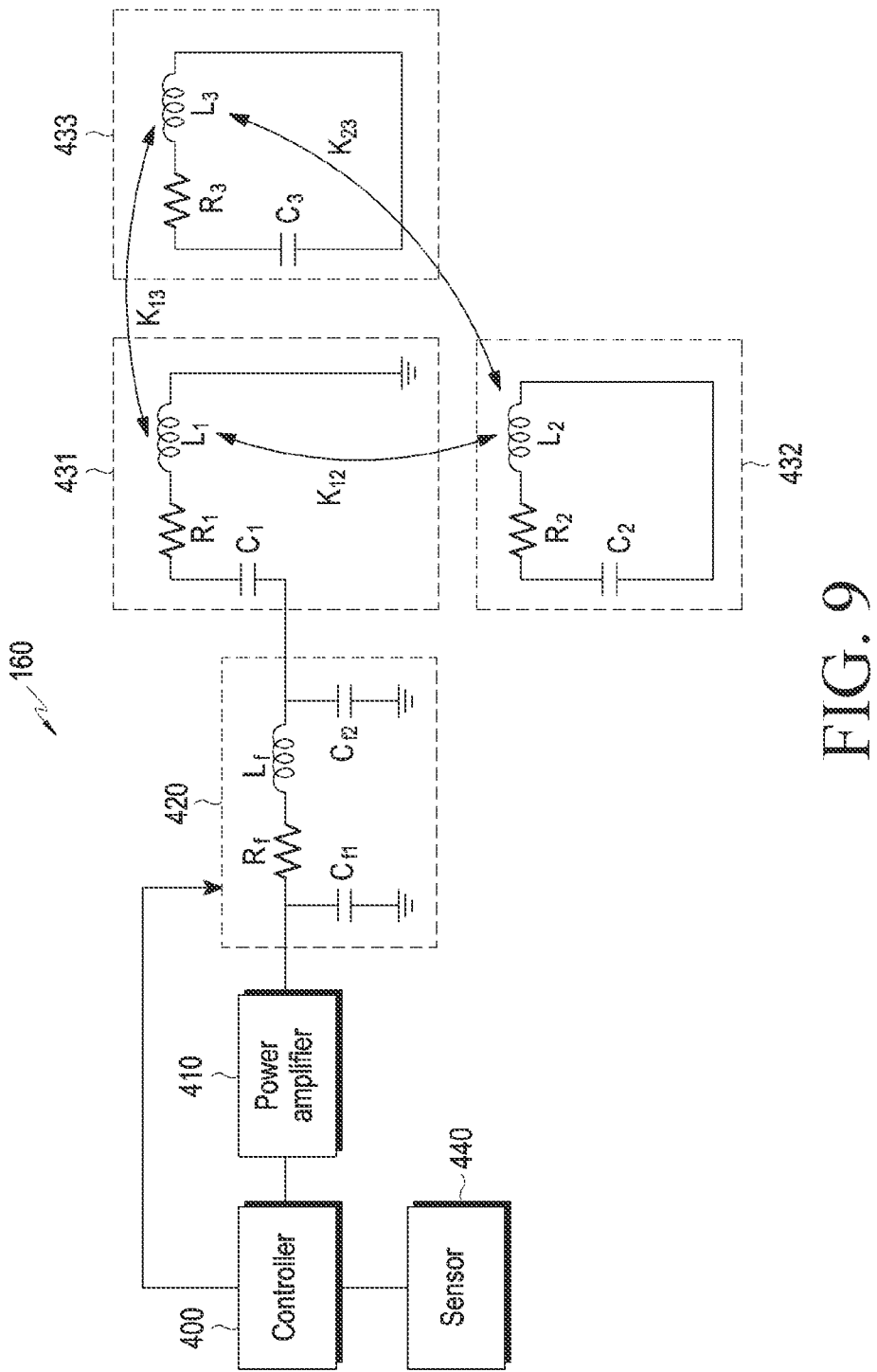
FIG. 9 is a circuit diagram illustrating an example wireless power transmitter according to various embodiments.

FIG. 9 is a circuit diagram illustrating an example wireless power transmitter according to various embodiments. Referring to FIG. 9, a third resonator 433 (e.g., the third resonator 233 of FIGS. 2A, 2B, and 2C) may be added to the wireless power transmitter illustrated in FIG. 4.

According to various embodiments, the third resonator 433 may be coupled to the first resonator 431 by an electromagnetic field through inductive coupling. A coupling coefficient between the first resonator 431 and the third resonator 433 may be expressed as $K_{13}$. For example, the first resonator 431 and the third resonator 433 may be electromagnetically coupled, for magnetic induction. For example, the third resonator 433 may transmit power to the wireless power receiver (e.g., the electronic device 150) by forming a magnetic field by power induced through the coupling with the first resonator 431. According to various embodiments, the third resonator 433 may include a third resistor $R_3$, a third coil $L_3$, and a third capacitor $C_3$. The third resistor $R_3$ may include a resistor disposed on the circuit of the third resonator 433, and in another embodiment, include a resistance value corresponding to the coil (e.g., the third coil $L_3$) included in the third resonator 433.

According to various embodiments, the third resonator 433 may be coupled to the second resonator 432 by an electromagnetic field through inductive coupling. A coupling coefficient between the second resonator 432 and the third resonator 433 may be expressed as $K_{23}$. For example, the second resonator 432 and the third resonator 433 may be electromagnetically coupled, for magnetic induction. For example, the third resonator 433 may transmit power to the wireless power receiver (e.g., the electronic device 150) by forming a magnetic field by power induced through coupling with the second resonator 432.

Figure 10:
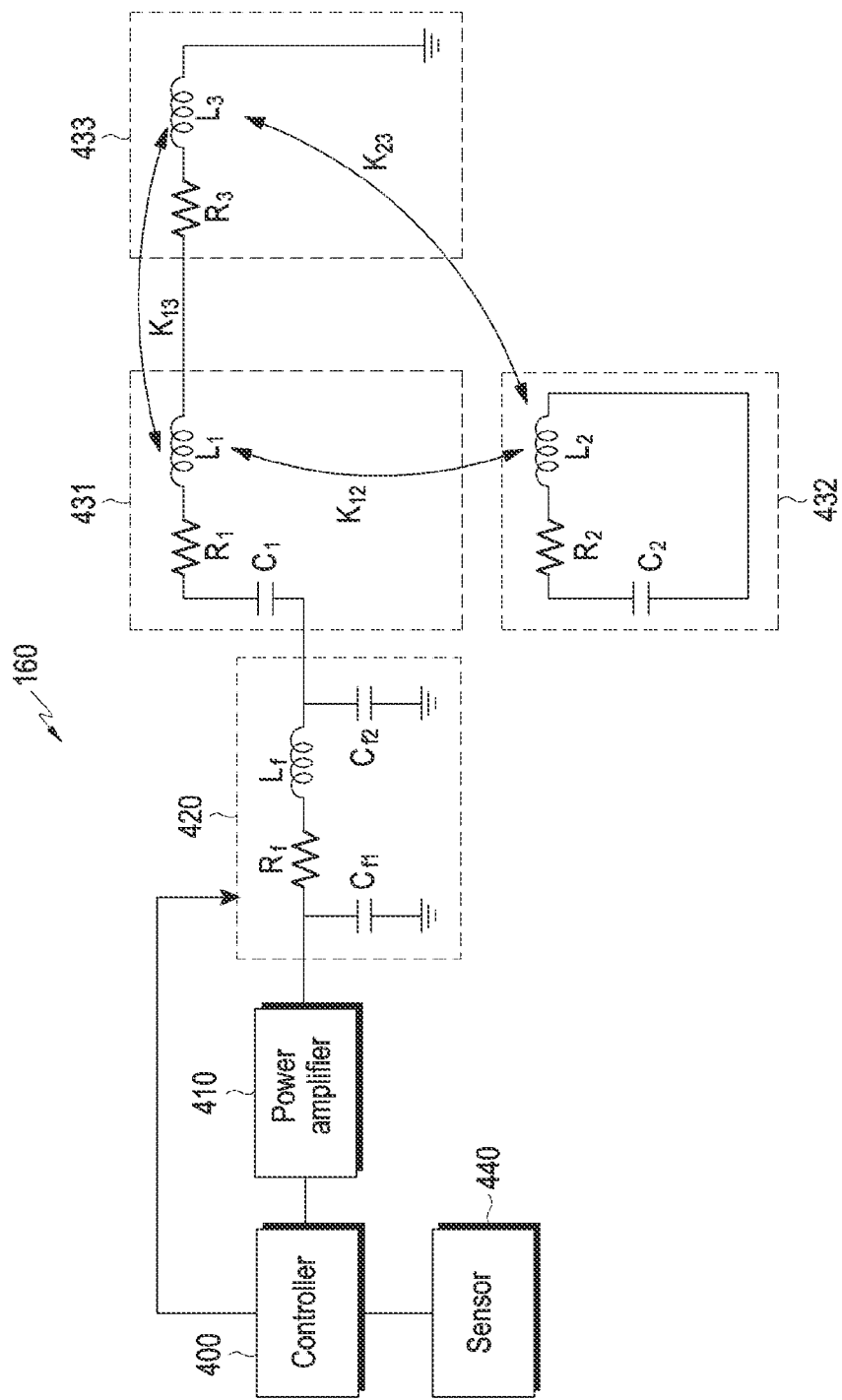
FIG. 10 is a circuit diagram illustrating an example wireless power transmitter according to various embodiments.

FIG. 10 is a circuit diagram illustrating an example wireless power transmitter according to various embodiments. Referring to FIG. 10, according to various embodiments, the third resonator 433 may be coupled wiredly to the first resonator 431.

Figure 11:
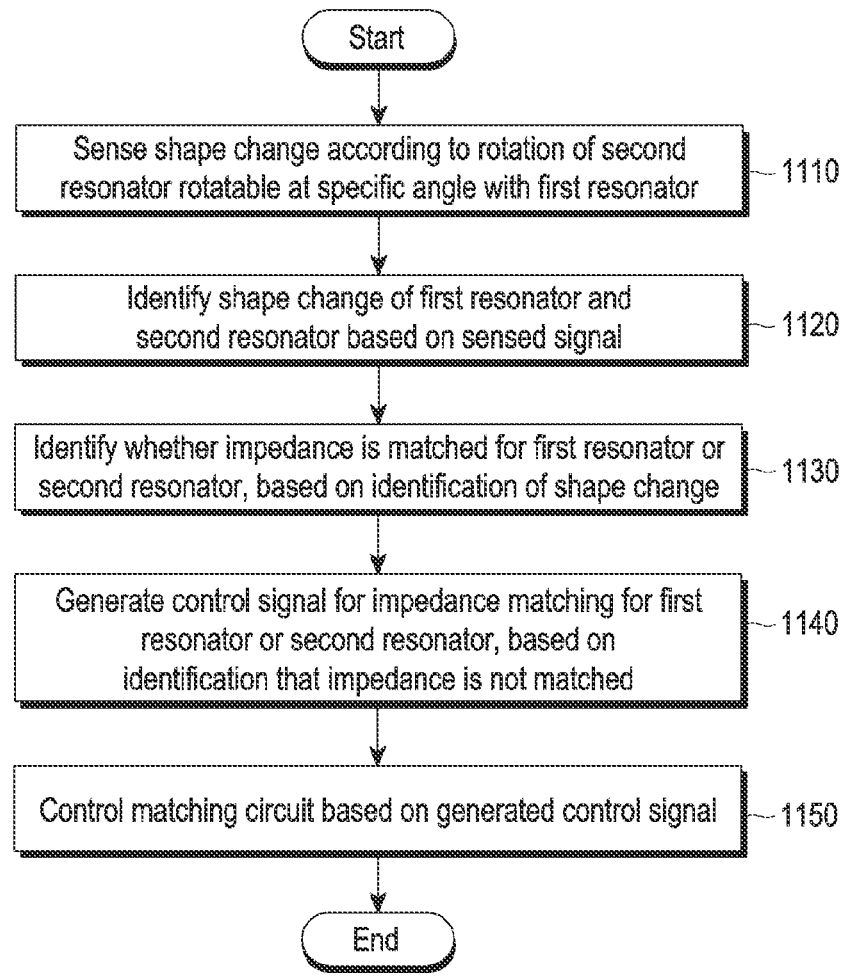
FIG. 11 is a flowchart illustrating an example method of controlling a wireless power transmitter according to various embodiments.

FIG. 11 is a flowchart illustrating an example method of controlling a wireless power transmitter according to various embodiments. Referring to FIG. 11, the wireless power transmitter (e.g., the wireless power transmitter 160 of FIG. 1A) may sense its shape change caused by rotation of a second resonator which is rotatable at a specific angle with a first resonator in operation 1110.

According to various embodiments, the wireless power transmitter (e.g., the controller 211 of the wireless power transmitter 160) may identify a change in the shapes of the first resonator and the second resonator based on a sensed signal in operation 1120.

According to various embodiments, the wireless power transmitter (e.g., the controller 211 of the wireless power transmitter 160) may identify whether impedance is matched for the first resonator or the second resonator based on the identification of the shape change in operation 1130.

According to various embodiments, the wireless power transmitter (e.g., the controller 211 of the wireless power transmitter 160) may generate a control signal for impedance matching for the first resonator or the second resonator based on identification that the impedance is not matched in operation 1140.

According to various embodiments, the wireless power transmitter (e.g., the controller 211 of the wireless power transmitter 160) may control the matching circuit based on the generated control signal in operation 1150.

Figure 12:
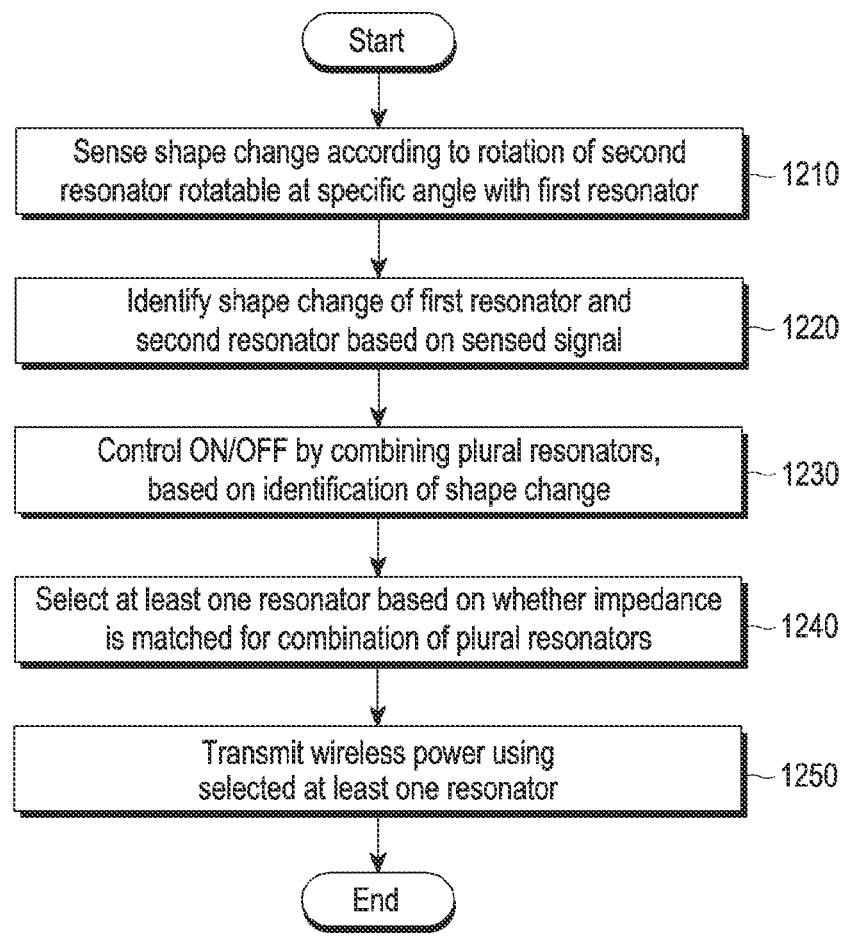
FIG. 12 is a flowchart illustrating an example method of controlling a wireless power transmitter according to various embodiments.

FIG. 12 is a flowchart illustrating an example method of controlling a wireless power transmitter according to various embodiments. Referring to FIG. 12, the wireless power transmitter (e.g., the wireless power transmitter 160 of FIG. 1A) may sense a shape change caused by rotation of a second resonator which is rotatable at a specific angle with a first resonator, in operation 1210.

According to various embodiments, the wireless power transmitter (e.g., the controller 211 of the wireless power transmitter 160) may identify a change in the shapes of the first resonator and the second resonator based on a sensed signal in operation 1220.

According to various embodiments, the wireless power transmitter (e.g., the controller 211 of the wireless power transmitter 160) may control on/off of a plurality of resonators in combination based on the identification of the shape change in operation 1230.

According to various embodiments, the wireless power transmitter (e.g., the controller 211 of the wireless power transmitter 160) may select at least one resonator based on whether impedance is matched for the combination of the plurality of resonators in operation 1240. For example, in the case where when the first resonator is controlled to the on state and the second resonator is controlled to the off state among the plurality of resonators, the impedance is not matched, and when the second resonator is controlled to the on state and the first resonator is controlled to the off state, the impedance is matched, the second resonator may be selected as a resonator for wireless power transmission.

According to various embodiments, the wireless power transmitter may control a transmission path of the first resonator or the second resonator to transmit wireless power using the selected at least one resonator in operation 1250.

According to various example embodiments, a wireless power transmitter may include: a housing; a power amplifier disposed inside the housing; a first resonator including at least one coil and fixed to a first portion of the housing; a second resonator including at least one coil, rotatably disposed at a second portion of the housing, and configured to form a variable angle with the first resonator; a sensor configured to sense a shape change based on rotation of the second resonator; a controller configured to: identify a shape change of the first resonator and the second resonator based on a signal sensed by the sensor, identify whether impedance is matched for the first resonator or the second resonator based on the identification of the shape change, and generate a control signal for impedance matching for the first resonator or the second resonator based on identifying that the impedance is not matched; and a matching circuit including at least one coil and at least one capacitor, electrically coupled between the power amplifier and the first resonator, and configured to perform impedance matching based on the control signal received from the controller.

According to various example embodiments, the second resonator may be coupled to the first resonator by an electromagnetic field.

According to various example embodiments, the second resonator may be electrically coupled to the first resonator.

According to various example embodiments, the controller may be configured to adjust impedance by changing a setting of the at least one capacitor of the matching circuit.

According to various example embodiments, the power amplifier may be coupled to the first resonator and configured to supply power to the first resonator.

According to various example embodiments, the wireless power transmitter may further include a third resonator including at least one coil and disposed at a third portion of the housing.

According to various example embodiments, the third resonator may be coupled to the first resonator by an electromagnetic field.

According to various example embodiments, the first resonator may correspond to a first Q-factor, and the second resonator may correspond to a second Q-factor different from the first Q-factor.

According to various example embodiments, the controller may be configured to: adjust impedance of the matching circuit to a first setting value based on identifying that the first resonator and the second resonator form a first angle, and adjust the impedance of the matching circuit to a second setting value different from the first setting value based on identifying that the first resonator and the second resonator form a second angle.

According to example various embodiments, the first resonator or the second resonator may include a ferrite to shield a magnetic field.

According to various example embodiments, a method of controlling a variable wireless power transmitter including a housing, a power amplifier disposed inside the housing, a first resonator including at least one coil and fixed to a first portion of the housing, and a second resonator including at least one coil, rotatably disposed at a second portion of the housing, and configured to form a variable angle with the first resonator may include: sensing a shape change based on rotation of the second resonator through a sensor; identifying a shape change of the first resonator and the second resonator based on a signal sensed by the sensor; identifying whether impedance is matched for the first resonator or the second resonator based on the identification of the shape change; generating a control signal for impedance matching for the first resonator or the second resonator based on identifying that the impedance is not matched; and adjusting impedance of a matching circuit including at least one coil and at least one capacitor based on the generated control signal.

According to various example embodiments, the second resonator may be coupled to the first resonator by an electromagnetic field.

According to various example embodiments, adjusting the impedance of the matching circuit may include adjusting the impedance by changing a setting of the at least one capacitor of the matching circuit.

According to various example embodiments, the variable wireless power transmitter may further include a third resonator including at least one coil and fixed to a third portion of the housing, and the third resonator may be coupled to the first resonator by an electromagnetic field.

According to various example embodiments, adjusting the impedance of the matching circuit may include adjusting the impedance of the matching circuit to a first setting value based on identifying that the first resonator and the second resonator form a first angle, and adjusting the impedance of the matching circuit to a second setting value different from the first setting value based on identifying that the first resonator and the second resonator form a second angle.

According to various example embodiments, a wireless power transmitter may include: a housing; a power amplifier disposed inside the housing; a first resonator including at least one coil and fixed to a first portion of the housing; a second resonator including at least one coil, rotatably disposed at a second portion of the housing, and configured to form a variable angle with the first resonator; a sensor configured to sense a shape change based on rotation of the second resonator; a controller configured to: identify a shape change of the first resonator and the second resonator based on a signal sensed by the sensor, select at least one resonator by sequentially controlling on/off of the first resonator or the second resonator based on the identification of the shape change, identify whether impedance is matched for the selected at least one resonator, and generate a control signal for impedance matching for the selected at least one resonator based on identification that the impedance is not matched; and a matching circuit including at least one coil and at least one capacitor, electrically coupled between the power amplifier and the first resonator, and configured to perform impedance matching based on the control signal received from the controller.

According to various example embodiments, the second resonator may be coupled to the first resonator by an electromagnetic field.

According to various example embodiments, the second resonator may be electrically coupled to the first resonator.

According to various example embodiments, the controller may be configured to adjust impedance by changing a setting of the at least one capacitor of the matching circuit.

According to various example embodiments, the wireless power transmitter may further include a third resonator including at least one coil and fixed to a third portion of the housing.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", or "connected to" another element (e.g., a second element), the element may be coupled with the other element directly (e.g., wiredly), wirelessly, or via a third element.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A wireless power transmitter comprising:
    a housing;
    a power amplifier disposed inside the housing;
    a first resonator including at least one coil and connected to a first portion of the housing;
    a second resonator including at least one coil, disposed at a second portion of the housing, and rotatable with respect to the first resonator;
    a matching circuit including at least one coil and at least one capacitor, and electrically coupled between the power amplifier and the first resonator;
    a sensor; and
    a controller, comprising processing circuitry, configured to:

identify information related to an angle between the first resonator and the second resonator based on a signal received from the sensor, identify whether impedance is matched such that a first impedance at an output node of the matching circuit is matched to a second impedance at an input node of the first resonator and/or the second resonator, based on identifying that the impedance is not matched:
generate a control signal for impedance matching based on the information, and
control the matching circuit to adjust impedance of the matching circuit based on the control signal.

2. The wireless power transmitter of claim 1, wherein the second resonator is coupled to the first resonator by an electromagnetic field.

3. The wireless power transmitter of claim 1, wherein the second resonator is electrically coupled to the first resonator.

4. The wireless power transmitter of claim 1, wherein the controller is configured to adjust impedance by changing a setting of the at least one capacitor of the matching circuit.

5. The wireless power transmitter of claim 1, wherein the power amplifier is coupled to the first resonator and configured to supply power to the first resonator.

6. The wireless power transmitter of claim 1, further comprising a third resonator including at least one coil and disposed at a third portion of the housing.

7. The wireless power transmitter of claim 6, wherein the third resonator is coupled to the first resonator by an electromagnetic field.

8. The wireless power transmitter of claim 1, wherein the first resonator corresponds to a first Q-factor, and the second resonator corresponds to a second Q-factor different from the first Q-factor.

9. The wireless power transmitter of claim 1, wherein the controller is configured to:
adjust impedance of the matching circuit to a first setting value based on identifying that the first resonator and the second resonator form a first angle, and
adjust the impedance of the matching circuit to a second setting value different from the first setting value based on identifying that the first resonator and the second resonator form a second angle.

10. The wireless power transmitter of claim 1, wherein the first resonator or the second resonator includes a ferrite to shield a magnetic field.

11. A method of controlling a variable wireless power transmitter including a housing, a power amplifier disposed inside the housing, a first resonator including at least one coil and connected to a first portion of the housing, and a second resonator including at least one coil, the second resonator disposed at a second portion of the housing and rotatable with respect to the first resonator, the method comprising:
identifying information related to an angle between the first resonator and the second resonator based on a signal received from a sensor;
identifying whether impedance is matched such that a first impedance at an output node of the matching circuit is matched to a second impedance at an input node of the first resonator and/or the second resonator;
based on identifying that the impedance is not matched:
generating a control signal for impedance matching based on the information; and
adjusting impedance of a matching circuit including at least one coil and at least one capacitor based on the control signal.

12. The method of claim 11, wherein the second resonator is coupled to the first resonator by an electromagnetic field.

13. The method of claim 11, wherein adjusting the impedance of the matching circuit comprises adjusting the impedance by changing a setting of the at least one capacitor of the matching circuit.

14. The method of claim 11, wherein the variable wireless power transmitter further includes a third resonator including at least one coil and fixed to a third portion of the housing, and
wherein the third resonator is coupled to the first resonator by an electromagnetic field.

15. The method of claim 11, wherein adjusting the impedance of the matching circuit comprises:
adjusting the impedance of the matching circuit to a first setting value based on identifying that the first resonator and the second resonator form a first angle, and
adjusting the impedance of the matching circuit to a second setting value different from the first setting value based on identifying that the first resonator and the second resonator form a second angle.

16. A wireless power transmitter comprising:
a housing;
a power amplifier disposed inside the housing;
a first resonator including at least one coil and connected to a first portion of the housing;
a second resonator including at least one coil, disposed at a second portion of the housing, and rotatable with respect to the first resonator;
a matching circuit including at least one coil and at least one capacitor, and electrically coupled between the power amplifier and the first resonator;
a sensor;
a controller, comprising processing circuitry, configured to:
identify information related to an angle between the first resonator and the second resonator based on a signal received from the sensor,
select at least one resonator by sequentially controlling on/off of the first resonator or the second resonator based the information,
identify whether impedance is matched such that a first impedance at an output node of the matching circuit is matched to a second impedance at an input node of the selected at least one resonator, and
in accordance with identifying that the impedance is not matched:
generate a control signal for impedance matching based on the information; and
control the matching circuit to adjust impedance of the matching circuit based on the control signal.

17. The wireless power transmitter of claim 16, wherein the second resonator is coupled to the first resonator by an electromagnetic field.

18. The wireless power transmitter of claim 16, wherein the second resonator is electrically coupled to the first resonator.

19. The wireless power transmitter of claim 16, wherein the controller is configured to adjust impedance by changing a setting of the at least one capacitor of the matching circuit.

20. The wireless power transmitter of claim 16, further comprising a third resonator including at least one coil and fixed to a third portion of the housing.

* * * * *